United States Patent
Nakamura et al.

(10) Patent No.: US 11,012,007 B2
(45) Date of Patent: May 18, 2021

(54) MAGNETOSTRICTION ELEMENT AND MAGNETOSTRICTION-TYPE VIBRATION POWERED GENERATOR USING SAME

(71) Applicant: Panasonic Intellectual Property Management Co., Ltd., Osaka (JP)

(72) Inventors: Taichi Nakamura, Osaka (JP); Kazuki Sakai, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 48 days.

(21) Appl. No.: 16/460,145

(22) Filed: Jul. 2, 2019

(65) Prior Publication Data
US 2020/0076332 A1   Mar. 5, 2020

(30) Foreign Application Priority Data
Aug. 30, 2018   (JP) .............................. JP2018-160992

(51) Int. Cl.
| | |
|---|---|
| *H02N 2/18* | (2006.01) |
| *H01L 41/20* | (2006.01) |
| *H01L 41/12* | (2006.01) |
| *C22C 38/00* | (2006.01) |

(52) U.S. Cl.
CPC .......... *H02N 2/188* (2013.01); *H01L 41/125* (2013.01); *H01L 41/20* (2013.01); *C22C 38/002* (2013.01)

(58) Field of Classification Search
CPC .......... H02N 2/18; H02N 2/188; H01L 41/12; H01L 41/125; H01L 41/20; C22C 38/002; C22C 38/00
See application file for complete search history.

(56) References Cited

U.S. PATENT DOCUMENTS

| | | |
|---|---|---|
| 2003/0010405 A1 | 1/2003 | Clark et al. |
| 2008/0011390 A1 | 1/2008 | Clark et al. |
| 2008/0115864 A1* | 5/2008 | Flatau ................. H01L 41/20 148/621 |
| 2017/0093306 A1 | 3/2017 | Ueno |
| 2017/0317266 A1 | 11/2017 | Imai |
| 2018/0233654 A1 | 8/2018 | Imai |
| 2020/0105997 A1* | 4/2020 | Nakamura ............ H01L 41/12 |
| 2020/0274056 A1* | 8/2020 | Shirotani ............. H01L 41/125 |

FOREIGN PATENT DOCUMENTS

| | | | | |
|---|---|---|---|---|
| JP | 2008-069434 | | 3/2008 | |
| JP | 2016-138028 | | 8/2016 | |
| JP | 2016138028 A | * | 8/2016 | ............ C30B 29/52 |
| JP | 2018203585 A | * | 12/2018 | |
| JP | 2019029502 A | * | 2/2019 | |
| WO | 2015/141414 | | 9/2015 | |

* cited by examiner

*Primary Examiner* — J. San Martin
(74) *Attorney, Agent, or Firm* — Wenderoth, Lind & Ponack, L.L.P.

(57) ABSTRACT

Provided herein is a magnetostriction element having a large power output and a high power density. The magnetostriction element is comprised of a magnetostrictive material that is a monocrystalline alloy represented by the following formula (1), $$\mathrm{Fe}_{(100-\alpha-\beta)}\mathrm{Ga}_\alpha\mathrm{X}_\beta, \quad \text{Formula (1)}$$

wherein α and β represent the Ga content (at %) and the X content (at %), respectively, X is at least one element selected from the group consisting of Sm, Eu, Gd, Tb, Dy, Cu, and C, and the formula satisfies $5 \leq \alpha \leq 40$, and $0 \leq \beta \leq 1$.

5 Claims, 3 Drawing Sheets

MAGNETOSTRICTION ELEMENT AND MAGNETOSTRICTION-TYPE VIBRATION POWERED GENERATOR USING SAME

CROSS-REFERENCE TO RELATED APPLICATIONS

The present application claims the benefit of foreign priority of Japanese patent application 2018-160992 filed on Aug. 30, 2018, the contents which is incorporated herein by reference.

TECHNICAL FIELD

The technical field relates to a magnetostriction element formed of a magnetostrictive material, and to a magnetostriction-type vibration powered generator using same.

BACKGROUND

Recent years have seen the arrival of the Internet of things (IoT), a world where "things" equipped with autonomous communication functions automatically control one another by exchanging information. The spread of IoT means a society with increasing numbers of IoT devices featuring communication functions. IoT devices, such as sensors, require a power supply to operate. However, the needs for wirings and service time, and the cost make it difficult to provide power supplies for these proliferating numbers of devices. This has created a need for a power supply technology suited for IoT devices in the coming era of IoT. Against this background, an important consideration is a technology called "energy harvesting", a process by which small amounts of energy from the everyday environment are converted into electrical power. Vibration is a form of energy source that is constantly produced by moving objects such as automobiles, trains, machinery, and humans in many places, and represents an energy source that is not influenced by weather or climate. It is therefore envisioned that a system that enables vibration-based power to be used as a power supply to applications coupled to movement of moving objects such as above can open the door to more effective IoT.

Vibration-based power generation can be divided into four categories: magnetostrictive, piezoelectric, electrostatic induction, and electromagnetic induction. In magnetostrictive power generation, a leakage magnetic flux due to a change in magnetic field inside a magnetostrictive material in response to applied stress is converted into electrical energy through a coil wrapped around the magnetostrictive material. The magnetostrictive power generation involves a smaller internal resistance, and generates more power than the other types of vibration-based power generation. Another characteristic of the magnetostrictive power generation is the desirable durability due to the metal alloy used as magnetostrictive material. This makes the magnetostrictive power generation a desirable mode of power generation that could overcome an issue associated with magnetostriction-type vibration powered generators or elements, namely, the durability of magnetostriction-type vibration powered generators or elements.

An example of a magnetostriction-type vibration powered generator is one having a cantilever beam structure. A traditional magnetostriction-type vibration powered generator having a cantilever beam structure has a magnetostrictive rod (or a magnetostriction element) formed of a magnetostrictive material; a coil wrapped around the magnetostrictive rod; a magnetic rod disposed parallel to the magnetostrictive rod; a frame curved in a U shape; and a magnet attached to inside of the frame (see WO2015/141414). The frame is a magnetic material with two ends. One of the ends on either side of the U-shaped bent portion is a fixed end, and the other end is a free end. In this way, a part of the frame works as a back yoke, and the frame forms an air gap between the magnet and the inner surface of the frame where the magnet is not attached.

In such a cantilever beam structure having a fixed end, the magnetostrictive rod is subjected to tensile and compressional stress when an external force (vibration) is applied within a horizontal plane, and this creates an alternating magnetic field in the magnetic field lines. Voltage is extracted in the form of electrical energy as the coil generates voltage in accordance with the law of electromagnetic induction, which states that voltage occurs in proportion to changes occurring in magnetic flux density over time.

In a magnetostriction-type vibration powered generator, power output P is represented by $P=NI \cdot d/dt(\int BdA)$, and power density B is represented by $E=P/v$. Here, N is the number of turns in the coil, I is the value of the current through the coil, B is the magnetic flux density of the magnetostriction element, A is the cross sectional area of the magnetostriction element, and v is the volume of the magnetostriction-type vibration powered generator. However, in the magnetostriction-type vibration powered generator above, the stress exerted on the magnetostriction element in response to an external force (vibration) applied within a horizontal plane in the cantilever beam structure is greater at the fixed end than at the free end, and this creates a stress distribution as a result of the stress not being exerted throughout the magnetostriction element in a uniform fashion. The stress distribution creates a distribution in the magnetic field lines running inside the magnetostriction element, and changes in the magnetic flux density B of the magnetostriction element become smaller as a whole, with the result that the power output P also becomes smaller. That is, the power density E (power output P per volume) is too small to achieve the high output (high power output) needed for IoT. Indeed, the power density F of the magnetostriction-type vibration powered generator needs to be improved for practical applications. For example, a magnetostriction-type vibration powered generator requires a consumed power density of about 1.0 mW/cm$^3$ in applications such as tire air pressure monitoring systems, and sensor networks for factories.

SUMMARY

The present disclosure is intended to provide a magnetostriction element and a magnetostriction-type vibration powered generator having a large power output and a high power density.

According to a first gist of the present disclosure, there is provided a magnetostriction element comprised of a magnetostrictive material that is a monocrystalline alloy represented by the following formula (1), $$Fe_{(100-\alpha-\beta)}Ga_\alpha X_\beta, \qquad \text{Formula (1)}$$

wherein α and β represent the Ga content (at %) and the X content (at %), respectively, X is at least one element selected from the group consisting of Sm, Eu, Gd, Tb, Dy, Cu, and C, and the formula satisfies 5≤α≤40, and 0≤β≤1, the magnetostriction element having a longitudinal direction along which the magnetostriction element extends between opposing first and second ends, the magnetostriction element having the <100> crystal orientation of the monocrystalline alloy along a direction parallel to the longitudinal direction, and having a. Ga concentration gradient that decreases in a direction from the second end to the first end.

In an aspect of the first gist of the present disclosure, the magnetostriction element may be plate-like in shape.

In an aspect of the first gist of the present disclosure, the Ga concentration may be 14 at % or more and 16 at % or less at the first end, and 17 at % or more and 19 at % or less at the second end.

In an aspect of the first gist of the present disclosure, the Ga concentration may decrease at an average rate of 0.15 at % or more and 0.2 at % or less per millimeter in the direction from the second end to the first end.

In an aspect of the first gist of the present disclosure, X may be at least one element selected from the group consisting of Sm, Cu, and C, and the formula may satisfy $14 \leq \alpha \leq 19$, and $0.5 \leq \beta \leq 1$.

According to a second gist of the present disclosure, there is provided a magnetostriction-type vibration powered generator comprising a power generating section, and a frame joined to the power generating section, the power generating section having a first end and a second end, and including:
a diaphragm formed of a non-magnetic material and disposed at the first end of the power generating section;
the magnetostriction element of claim 1 disposed at the second end of the power generating section; and
a coil wrapped around the magnetostriction element along the longitudinal direction,
the frame having a first end and a second end, and including:
a frame body formed of a magnetic material and joined to the second end of the power generating section at the first end of the frame, the frame body extending between the first end and the second end of the frame; and
a magnet provided on the frame body so as to face the magnetostriction element of the power generating section,
the magnetostriction element being disposed in such an orientation that the direction from the second end to the first end of the power generating section corresponds to the longitudinal direction of the magnetostriction element, and that the magnetostriction element joins the diaphragm at the first end of the magnetostriction element.

In an aspect of the second gist of the present disclosure, the power generating section and the frame may have a C-shape as a whole.

In an aspect of the second gist of the present disclosure, the magnet may be provided on the frame body so as to face the magnetostriction element at the first end of the magnetostriction element.

The present disclosure has provided a magnetostriction element and a magnetostriction-type vibration powered generator having a large power output and a high power density.

DESCRIPTION OF EMBODIMENTS

Figure 1:
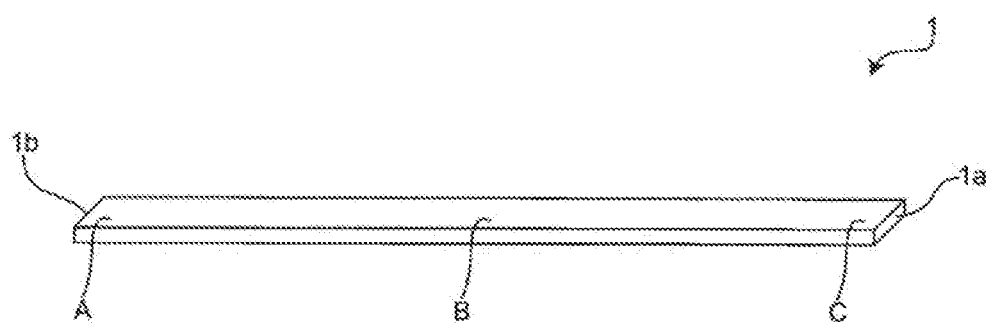
FIG. 1 is a schematic diagram of a magnetostriction element of an embodiment of the present disclosure.

The following describes a magnetostriction element, and a method of manufacture thereof according to an embodiment of the present disclosure. A magnetostriction-type vibration powered generator provided with the magnetostriction element is also described. It is to be noted that the present disclosure is not limited to the embodiments below.

Magnetostriction Element

The magnetostriction element of the present embodiment is formed of a magnetostrictive material that is a monocrystalline alloy represented by the following formula (1),

$Fe_{(100-\alpha-\beta)}Ga_\alpha X_\beta$,  Formula (1)

wherein α and β represent the Ga content (at %) and the X content (at %), respectively, X is at least one element selected from the group consisting of Sm, Eu, Gd, Tb, Dy, Cu, and C, and the formula satisfies $5 \leq \alpha \leq 40$, and $0 \leq \beta \leq 1$.

The magnetostriction element has a longitudinal direction along which the magnetostriction element extends between opposing first and second ends.

The magnetostriction element has the <100> crystal orientation of the monocrystalline alloy along a direction parallel to the longitudinal direction, and has a Ga concentration gradient that decreases in a direction from the second end to the first end.

The FeGaX monocrystalline alloy of the formula (1) includes an. FeGa binary alloy because β can take a value of 0.

Preferably, X in the formula (1) is at least one element selected from the group consisting of Sm, Cu, and C, and the formula satisfies $14 \leq \alpha \leq 19$, and $0.5 \leq \beta \leq 1$. In another embodiment, the formula (1) satisfies $14 \leq \alpha \leq 19$, and $\beta=0$, preferably $17 \leq \alpha \leq 18.4$, and $\beta=0$.

The magnetostriction element of the present embodiment may have any appropriately selected shape. For example, the magnetostriction element of the present embodiment may have a rectangular shape (or a plate-like shape), a cubic shape, a columnar shape, a polygonal column shape, or some other solid shape. The preferred shape is a plate-like shape. In the case of a plate-like shape, the magnetostriction element may have, for example, cross sectional dimensions measuring 5 mm to 20 mm in width, and 1 mm to 3 mm in height, preferably about 10 mm in width, and about 1 mm in height. The longitudinal length (the distance be the opposing ends along the longitudinal direction) may be 10 mm to 30 mm, preferably about 30 mm, more preferably about 20 mm.

As used herein, "Ga concentration" represents a fraction of the number of Ga atoms with respect to the total number of atoms in the alloy, and has a value in at % (atomic percent). More specifically, "Ga concentration" is a Ga content as measured by analysis of the alloy using an electron probe microanalyzer (EPMA). Similarly, the concentrations or contents of the other elements (for example, Fe, Sm, Eu, Gd, Tb, Dy, Cu, and C) in the alloy are measured values in at % (atomic percent) obtained by using the same method. It is to be noted here that the monocrystalline alloy (an FeGa alloy or an FeGaX alloy) constituting the magnetostriction element of the present embodiment may contain trace amounts of unavoidable elements (for example, less than 0.005 at % of oxygen), provided that the monocrystalline alloy is configured essentially from the elements specified above.

As used herein, "gradient" means the presence of an increase or a decrease of a predetermined value, for example, a concentration, along a direction from one specified location to another. Specifically, the term "gradient" as used herein means monotonous decrease or monotonous increase. To be more specific, in the present disclosure, the Ga concentration gradient is a measured EPMA value taken end-to-end at the center of the magnetostriction element, for example, by a spot analysis at different points of the magnetostriction element, or by a line analysis of the magnetostriction element.

In the present disclosure, the <100> crystal orientation of the monocrystalline alloy can be determined by using a known method. However, specifically, the <100> crystal orientation of the monocrystalline alloy is one determined by using an EBSD (Electron Backscatter Diffraction) technique. The <100> orientation of the FeGa alloy or FeGaX alloy is not easily magnetizable. However, the magnetostriction element is able to produce large magnetostriction because the monocrystalline alloy in the magnetostriction element of the present embodiment has the <100> crystal orientation along a direction parallel to the longitudinal direction of the magnetostriction element. The magnetostriction element of the present embodiment can also produce large magnetostriction when the direction parallel to the longitudinal direction of the magnetostriction element has a small angle difference of 10° or less, preferably 6° or less, more preferably 4° or less from the <100> crystal orientation of the FeGa alloy or FeGaX alloy. Such a magnetostriction element also represents the magnetostriction element of the present embodiment.

The magnetostriction element of the present embodiment is described below in greater detail, with reference to the accompanying drawings.

FIG. 1 is a schematic diagram of a magnetostriction element of an embodiment of the present disclosure. A magnetostriction element 1 is formed of a magnetostrictive material that is a monocrystalline alloy represented by the foregoing formula (1). As illustrated in FIG. 1, the magnetostriction element 1 is a plate-shaped element extending along its longitudinal direction between a first end 1a at one end of the magnetostriction element and a second end 1b at the opposite end. As illustrated in FIG. 1, the magnetostriction element has a spot A at the second end 1b side of the magnetostriction element, a spot B in the middle, and a spot C at the first end 1a side of the magnetostriction element along the longitudinal direction between the first end 1a and the second end 1b of the magnetostriction element. The magnetostriction element 1 has the <100> crystal orientation of the monocrystalline alloy of formula (1) along direction parallel to the longitudinal direction, and has decreasing Ga concentrations from spot A to spot B and to spot C when measured at these points.

Preferably, the Ga concentration is 14 at % to 16 at % at the first end 1a of the magnetostriction element, and 17 at % to 19 at % at the second end 1b of the magnetostriction element. Preferably, the Ga concentration becomes smaller from the second end 1b of the magnetostriction element toward the first end 1a of the magnetostriction element at an average rate of 0.15 at % to 0 at % per millimeter. The Ga concentration at the first end 1a of the magnetostriction element and at the second end 1b of the magnetostriction element may be a concentration at a location near the edge (or side) of the magnetostriction element 1. For example, the Ga concentration is a concentration as measured in a region within 0 to 3 mm, typically about 0.5 to 2.5 mm, from the edge of the magnetostriction element 1.

Figure 2:
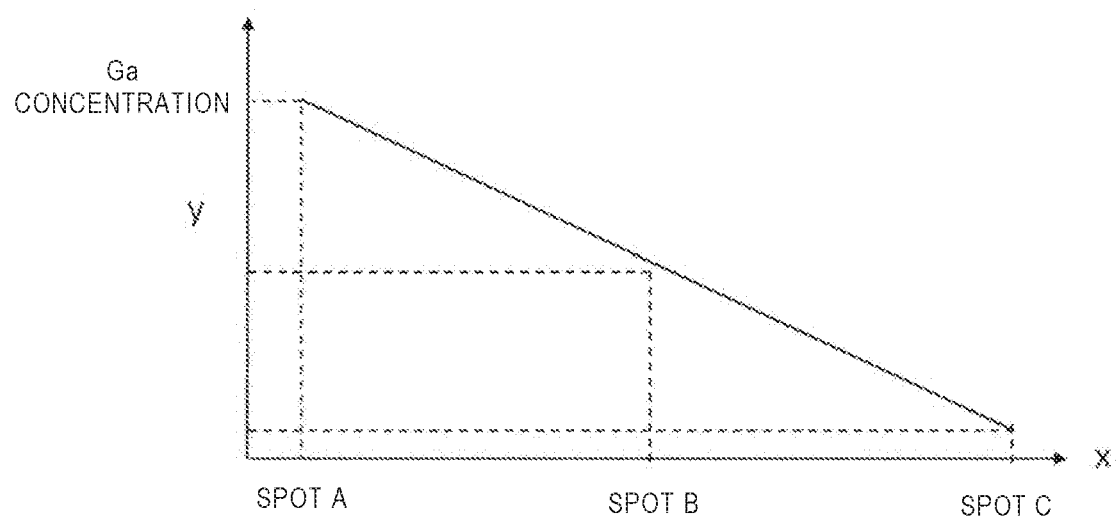
FIG. 2 is a graph schematically representing a distribution of Ga concentration in the magnetostriction element of the embodiment of the present disclosure.

FIG. 2 is a graph schematically representing a distribution of Ga concentration in the magnetostriction element of the embodiment of the present disclosure. In FIG. 2, the x axis represents spots A, B, and C of the magnetostriction element 1, and the y axis represents the Ga concentration (at %) of the magnetostriction element 1. For example, as schematically represented in the distribution graph, the Ga concentration of the magnetostriction element 1 of the present embodiment has a concentration gradient, and monotonously decreases from spot A to spot C (from the second end 1b of the magnetostriction element to the first end 1a of the magnetostriction element along the longitudinal direction).

Because of the Ga concentration gradient, the magnetostriction element 1 of the embodiment of the present disclosure shows different magnetic characteristics (magnetic anisotropy) in the gradient. Specifically, in the magnetostriction element 1, the extent of magnetic flux density change is different at different points of the Ga concentration gradient. In the present disclosure, a magnetic flux density change due to applied stress can be measured with a B-H curve measurement device installed in a tensile-compression tester.

The method used to produce the magnetostriction element 1 according to the present embodiment is not particularly limited, and any appropriately selected alloy manufacturing method may be used. Examples of such methods include the Czochralski technique (CZ technique), the Bridgeman technique, and a rapid solidification method. With the CZ technique, large crystals can be produced with accurate chemical compositions and crystal orientations. The Ga concentration gradient in the magnetostriction element 1 can be created by a skilled person forming the magnetostriction element 1 using, for example, the CZ technique. For example, the crucible is rotated in the reversed direction from the direction of rotation of a seed crystal, and each step is performed under appropriately adjusted conditions (for example, the rotation speed of the seed crystal and the crucible, and pressure). The concentration can then be measured and confirmed by EPMA analysis. The magnetostriction element 1 can be shaped as desired using any known technique. For example, the magnetostriction element 1 may be cut out by wire discharge machining.

Magnetostriction-Type Vibration Powered Generator

Figure 3:
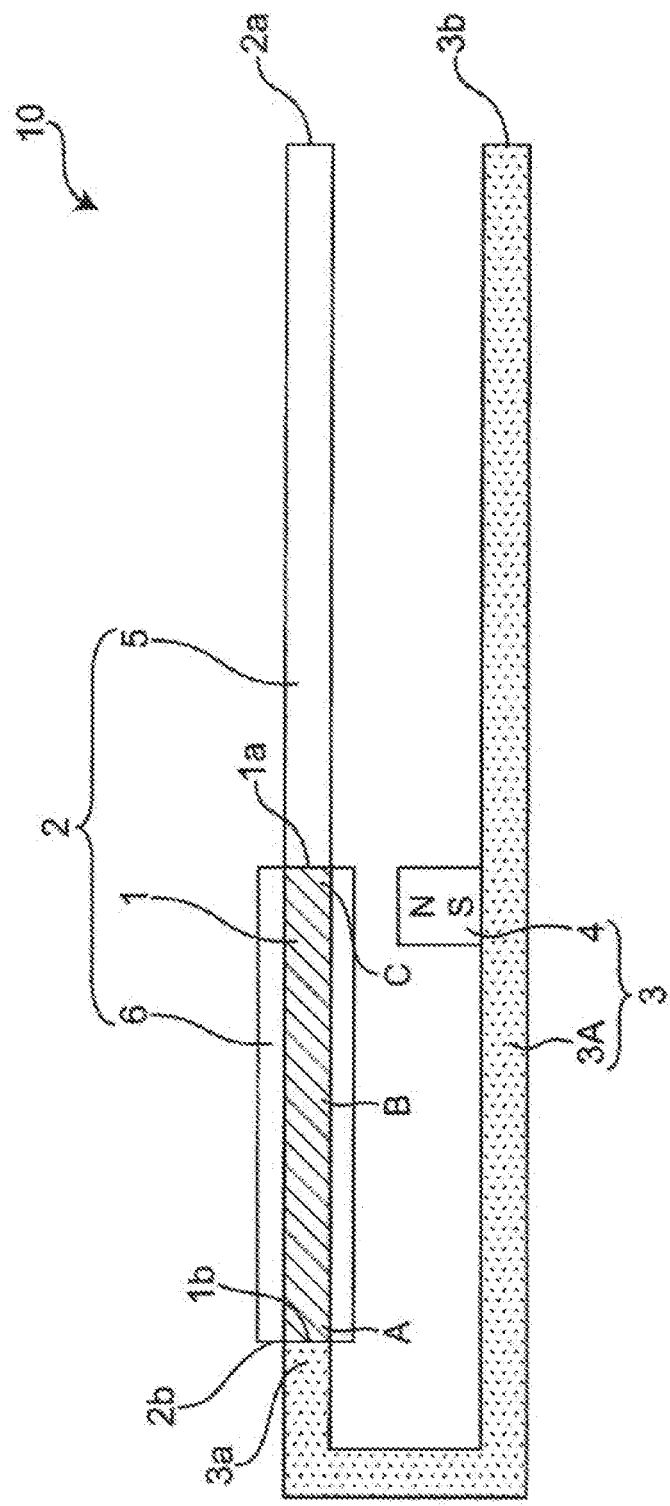
FIG. 3 is a cross sectional view representing a magnetostriction-type vibration powered generator equipped with the magnetostriction element of the embodiment of the present disclosure.
Figure 4:
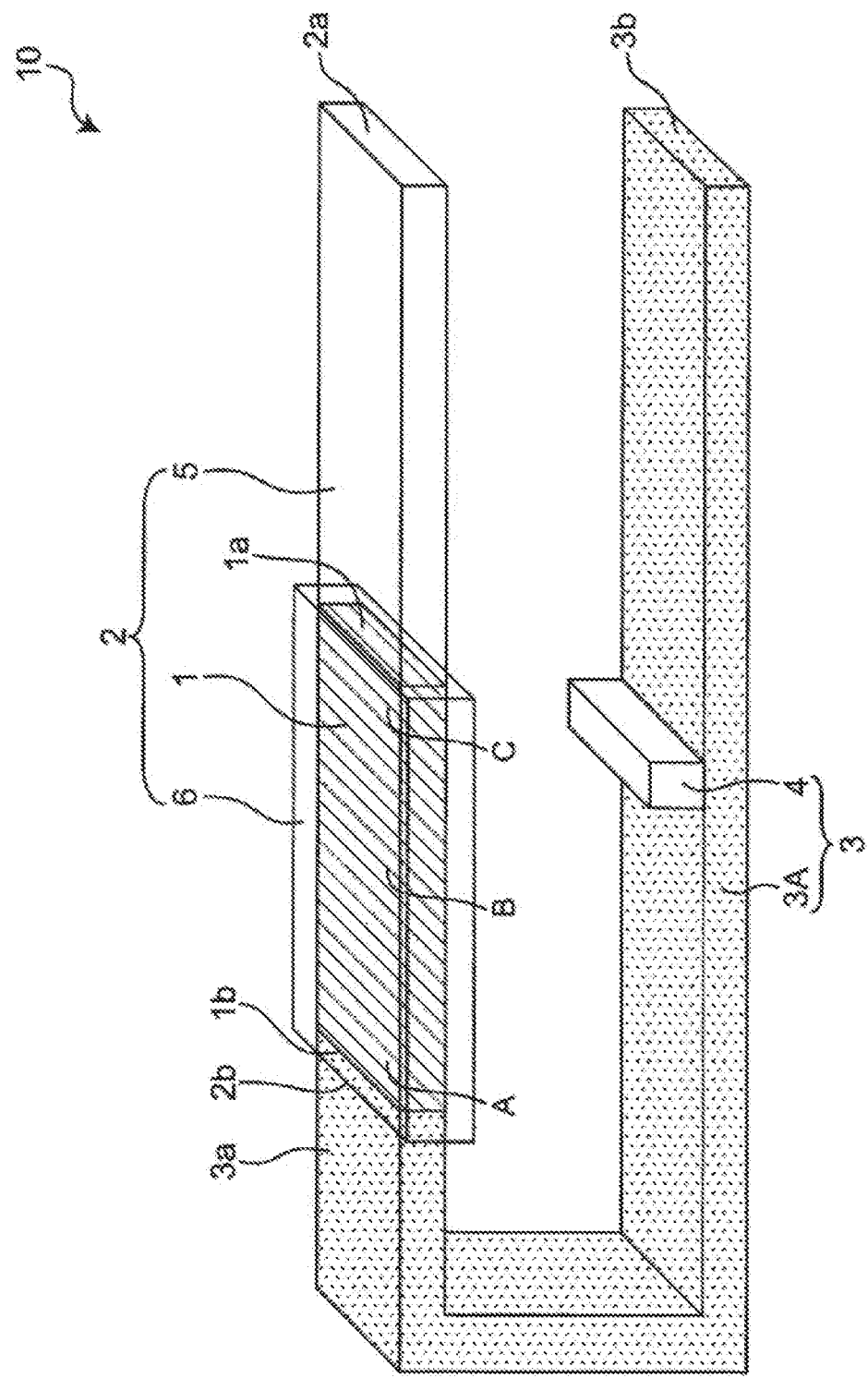
FIG. 4 is a perspective view representing the magnetostriction-type vibration powered generator equipped with the magnetostriction element of the embodiment of the present disclosure.

FIG. 3 is a cross sectional view of a magnetostriction-type vibration powered generator equipped with the magnetostriction element of the embodiment of the present disclosure. FIG. 4 is a perspective view of the magnetostriction-type vibration powered generator equipped with the magnetostriction element of the embodiment of the present disclosure. As illustrated in FIGS. 3 and 4, a magnetostriction-type vibration powered generator 10 includes a power generating section 2, and a frame 3 joined to the power generating section 2.

The power generating section 2 has a first end 2a and a second end 2h. The frame 3 has a first end 3a and a second end 3b. The second end 2h of the power generating section is joined to the first end 3a of the frame.

The method used to join the second end 2b of the power generating section to the first end 3a of the frame is not particularly limited, as long as it does not seriously impair the function of the magnetostriction-type vibration powered generator 10 of the present embodiment as a whole, specifically, the function that forms an appropriate magnetic circuit. For example, these ends may be fixed to each other using screws, bolts, nuts, solders, adhesives, or brazing filler metals, particularly, screws, bolts, or nuts.

The frame 3 has a frame body 3A and a magnet 4. The frame body 3A is made of a magnetic material, particularly, a ferromagnetic material, and extends between the first end 3a and the second end 3b of the frame. For example, the ferromagnetic metallic material may be a cold rolled steel plate, or a steel band (SPCC, SPCD, SPCE, SPCF, SPCG). The frame body 3A shown in FIGS. 3 and 4 has a C-shape. However, the shape is not particularly limited, as long as the constituent members are joined to one another, and function as the magnetostriction-type vibration powered generator 10 after manufacture. For example, the power generating section 2 and the frame 3, as a whole, may have, for example, a C- or a U-shape after being joined to each other. Specifically, the shape is not limited, as long as the power generating section 2 extending end-to-end between the second end 2b and the first end 2a is facing the frame body 3A extending toward the second end 3b of the frame, and the first end 2a (the end on the diaphragm 5 side, specifically, the free end) of the power generating section is facing the second end 3b (the fixed end) of the frame.

The magnet 4 is provided on the frame body 3A, opposite the magnetostriction element 1 of the power generating section 2. Preferably, the magnet 4 is provided on the frame body 3A so as to face the magnetostriction element 1 at the first end 1a of the magnetostriction element 1. Specifically, the magnet 4 may be provided so as to form an air gap with the magnetostriction element 1. With such an air gap, it is possible to form a desirable closed magnetic circuit of the magnet 4, the magnetostriction element 1, and the frame body 3A through the air gap. The magnet 4 is not particularly limited, as long as it is a substance having the property to attract a magnetic material, and that generates a bipolar magnetic field. Examples of such materials include a neodymium magnet, a samarium-cobalt magnet, and an alnico magnet. Preferably, the magnet is a neodymium magnet.

The frame body 3A and the magnet 4 can be installed, for example, simply by mounting the magnet 4 on the frame body 3A, which is a magnetic material. With the magnet 4 mounted on the frame body 3A, the generated magnetic force can hold the magnet 4 in place with the magnetic field lines running through the frame body 3A. The magnet 4 may be installed or attached using a method involving other types of magnetic forces. When the frame body 3A and the magnet 4 are bonded to each other with an adhesive or other such materials that do not easily pass magnetic field lines, the resulting magnetic circuit is reduced in size as such materials become magnetic reluctance.

As illustrated FIGS. 3 and 4, the power generating section includes a diaphragm 5 and a coil 6, in addition to the magnetostriction element 1 of the embodiment described above.

The diaphragm 5 is disposed at the first end 2a of the power generating section. The material of the diaphragm 5 is not particularly limited, as long as it is a non-magnetic material. For example, the diaphragm 5 is configured from a non-magnetic material such as a non-magnetic metal (for example, aluminum, titanium, copper, or brass), and a resin (for example, acrylic resin). By varying the dimensions (length and thickness) of the diaphragm 5 or by attaching a weight to the diaphragm 5, the spring characteristics of the diaphragm 5 can be altered to adjust the resonant frequency.

The magnetostriction element 1 is disposed at the second end 2b of the power generating section. The magnetostriction element 1, which is the magnetostriction element 1 of the embodiment described above, is disposed in such an orientation that the direction from the second end 2b to the first end 2a of the power generating section corresponds to the longitudinal direction of the magnetostriction element 1, and that the magnetostriction element joins the diaphragm 5 at the first end 1a, that is, the end with a lower Ga concentration (in the vicinity of spot C).

In the magnetostriction element 1, the Ga concentration is higher at spot A, and the magnetic flux density difference under no load and under applied stress is large at spot A when the applied stress is large. At spot C, where the Ga concentration is lower, the magnetic flux density difference under no load and under applied stress is large when the applied stress is small. Accordingly, the magnetostriction element 1, which is made of an FeGa alloy or an FeGx alloy, can effectively produce a large magnetic flux density change as a whole when the magnetostriction element 1 has its second end 1b, near spot A, disposed on the frame side of the magnetostriction element (fixed-end side) and its first end 1a, near spot C, disposed on the diaphragm 5 side (free-end side) This is because the configuration of the magnetostriction-type vibration powered generator 10 is such that the magnetostriction element 1 experiences a greater stress at the fixed end than at the free end. In this way, the magnetostriction-type vibration powered generator 10 can have increased power density. In the present disclosure, a magnetic flux density difference under no load and under applied stress means a magnetic flux density difference between the magnetic flux density measured under no load with a B-H curve measurement device, and the magnetic flux density measured under applied tensile or compressional stress with a B-H curve measurement device installed in a tensile-compression tester.

The method used to attach (or join) the diaphragm 5 to the magnetostriction element 1 is not particularly limited. For example, these may be fixed to each other using, for example, screws, bolts, nuts, solders, adhesives, brazing filler metals, or double-sided tapes. Preferably, the diaphragm 5 and the magnetostriction element 1 are fixed to each other with screws, bolts, nuts, or the like.

The coil 6 is wrapped around the magnetostriction element 1 along the direction of extension of the magnetostriction element 1, that is, in a direction from the second end 2b to the first end 2a of the power generating section. The coil 6 generates a voltage that is proportional to the time-dependent changes occurring in the magnetic field lines running through the magnetostriction element 1, in accordance with the law of electromagnetic induction. The material of the coil 6 is not particularly limited. For example, a copper wire may be used. A generated voltage can be determined by $V = N \cdot d\Phi/dt$, where N is the number of turns in the coil 6, and $\Phi$ is the magnetic flux. Accordingly, a large voltage can be generated by increasing the amount of magnetic flux change per unit time, or by increasing the number of turns in the coil 6. The amount of magnetic flux change per unit time is determined by the resonant frequency or other mechanical characteristics of the power-generating element. Accordingly, an easier way of increasing the generated voltage of the power-generating element is to increase the number of turns in the coil 6.

EXAMPLES

The present disclosure is described below in greater detail by way of Examples and Comparative Examples. The present disclosure, however, is not limited by the following descriptions.

Example 1

In Example 1, a plate-shaped FeGa-alloy magnetostriction element was produced that had varying Ga concentrations along its longitudinal direction. The magnetostriction element was then measured for magnetic flux density under no applied stress and under applied compressional stress, and changes occurring in magnetic flux density were confirmed.

Production of Magnetostriction Element

In order to produce an FeGa-alloy magnetostriction element of Example 1-1, iron (purity 99.999%) and gallium (purity 99.999%) were weighed with an electronic balance. The content of each element in alloy specimens was measured and adjusted by EPMA analysis.

Specimens were grown using a high-frequency dielectric heating CZ furnace. A dense alumina crucible measuring 45 mm in outer diameter ($\phi$) was disposed inside a graphite crucible having an inner diameter $\phi$ of 50 mm, and weighed 400 g of Fe and Ga was supplied as raw materials of each alloy specimen. The crucibles charged with the raw materials were placed in a growth furnace, and an argon gas was introduced after creating a vacuum inside the furnace. Heat was applied as soon as the pressure inside the furnace became atmospheric pressure, and the alloy was heated for 12 hours, until a melt was obtained. An FeGa monocrystal was cut to produce a seed crystal of <100> orientation, and the seed crystal was lowered down to the vicinity of the melt. While being rotated at 5 ppm, the seed crystal was then gradually lowered toward the melt until the tip of the seed crystal contacted the melt. In order to create a Ga concentration gradient in the specimen, the crucible was rotated at 10 rpm in the opposite direction from the seed crystal, and the crystal was grown by gradually decreasing temperature, before lifting the seed crystal at a rate of 1.0 mm/hr. This produced a monocrystalline alloy having a Ga concentration gradient and measuring 10 mm in diameter and 80 mm in length along the length of its body. For measurement, the monocrystalline alloy was cut into a plate-shaped magnetostriction element by wire discharge machining. Here, the plate-shaped magnetostriction element had cross sectional dimensions measuring 10 mm in width, 1 mm in height, and 20 mm in length. (a longitudinal distance between the first end and the second end). The longitudinal direction was parallel to the <100> orientation of the FeGa alloy. This produced the FeGa-alloy magnetostriction element of Example 1-1 of the shape shown in FIG. 1 having varying Ga concentrations along the longitudinal direction.

In order to produce an FeGa-alloy magnetostriction element of Comparative Example 1-1, an FeGa monocrystalline alloy was produced using the Bridgeman technique, which enables growth of monocrystals or a uniform composition. As in Example 1-1, the monocrystalline alloy was cut by wire discharge machining into a plate shape measuring 10 mm×1 mm in cross section and 20 mm in length (a longitudinal distance between the first end and the second end). Here, the longitudinal direction was parallel to the <100> orientation of the FeGa alloy, as in Example 1-1.

Ga Concentration Measurement of Magnetostriction Elements

The Ga concentrations of the magnetostriction elements of Example 1-1 and Comparative Example 1-1 were measured by EPMA analysis. Specifically, the Ga concentrations of the FeGa monocrystalline alloys were measured at spots A, B, and C shown in FIG. 1.

Magnetic Flux Density Measurement of Magnetostriction Element Under No Applied Stress and Under Applied Compressional Stress The magnetostriction elements of Example 1-1 and Comparative Example 1-1 were measured for magnetic flux density under no applied stress and under applied stress (under 5 MPa compressional stress and under 15 MPa compressional stress) at 8 kA/m. Specifically, the magnetic flux density was measured for a length of about 2 mm in the vicinity of spots A, B, and C shown in FIG. 1. This was accomplished by using a B-H measurement device with a short-length detection coil.

Table 1 shows the results of the Ga concentration (at %; the rest is the Fe concentration (at %)) measurements at spots A, B, and C, and the results of the magnetic flux density (T) measurements for the FeGa-alloy magnetostriction elements of Example 1-1 and Comparative Example 1-1 conducted under no applied stress and under applied compressional stress.

TABLE 1

|  |  | Ex. 1-1 | Com. Ex. 1-1 |
|---|---|---|---|
| Ga concentration at spot A [at. %] |  | 18.4 | 18.4 |
| Ga concentration at spot B [at. %] |  | 16.9 | 18.4 |
| Ga concentration at spot C [at. %] |  | 15.4 | 18.4 |
| Magnetic flux density [T] under no load | Near spot A | 1.6 | 1.6 |
|  | Near spot B | 1.2 | 1.6 |
|  | Near spot C | 0.8 | 1.6 |
| Magnetic flux density [T] under 5 MPa compression | Near spot A | 1.5 | 1.5 |
|  | Near spot B | 1.0 | 1.5 |
|  | Near spot C | 0.5 | 1.5 |
| Magnetic flux density [T] under 15 MPa compression | Near spot A | 0.8 | 0.6 |
|  | Near spot B | 0.7 | 0.6 |
|  | Near spot C | 0.6 | 0.6 |

As shown in Table 1, the Ga concentration was 1.5 at % lower at spot B, and 3 at % lower at spot C than at spot A in Example 1-1. That is, because the magnetostriction element was 20-mm long, the magnetostriction element of Example 1-1 had a composition gradient in which the Ga concentration monotonously decreased at 0.15 at %/mm. In Comparative Example 1-1, the Ga concentration was 18.4 at % in all of spot A, B, and C, and the composition was uniform.

In Example 1-1, the magnetic flux density monotonously decreased with the measured value of 1.6 T at spot A, 1.2 T at spot B, and 0.8 T at spot C under no applied stress. This result is considered to be due to the decreasing Ga concentrations from spot A to spot C in the FeGa-alloy magnetostriction element of Example 1-1. That is, there appears to be a correlation between Ga concentration and magnetic flux density. The same correlation also should be present under applied compressional stress. Under an applied compressional stress of 5 MPa, the magnetic flux density showed a decrease from 1.5 T at spot A to 1.0 T at spot B, and to 0.5 T at spot C. Similarly, under an applied compressional stress of 15 MPa, the magnetic flux density showed a decrease from 0.8 T at spot A to 0.7 T at spot B, and to 0.6 T at spot C. These results also suggest that there is a correlation between Ga concentration and magnetic flux density.

In Comparative Example 1-1, the Ga concentration was uniform, with spots A, B, and C all showing a Ga concentration of 18.4 at %. Here, the magnetic flux density was 1.6 T under no applied stress, and 1.5 T and 0.6 T under applied compressional stress (under 5 MPa and under 15 MPa), regardless of the spot, A, B, or C. It can be said from these results that there is a correlation between Ga concentration and magnetic flux density.

The results for Example 1-1 and Comparative Example 1-1 showed that there is a correlation between Ga concentration and magnetic flux density in the magnetostriction elements formed of FeGa-alloy magnetostrictive material, and that, with the Ga concentration gradient in the composition of the magnetostriction element, the magnetic flux density also has a gradient, under no applied stress and under applied compressional stress. In both Example 1-1 and Comparative Example 1-1, the magnetic flux density was smaller under applied compressional stress than under no applied stress. This is probably a result of the hindered motion of the domain wall inside the magnetostriction element due to the applied compressional stress to the magnetostriction element formed of magnetostrictive material.

Example 2

In Example 2, magnetostriction elements of various Ga concentrations were produced in the same manner as for the FeGa-alloy magnetostriction element of Example 1-1. These were then measured for magnetic flux density under no applied stress and under applied compressional stress, and changes occurring in magnetic flux density were confirmed. For the evaluation of the power density of each magnetostriction element, the magnetostriction element was installed in a magnetostriction-type vibration powered generator of the configuration shown in FIGS. 3 and 4, and measured for power density.

The magnetostriction elements used for measurement had a plate shape as in Example 1-1. The Ga concentrations in the magnetostriction elements had the values shown in Table 2 at spots A, B, and C as measured by EPMA analysis (the rest is the Fe concentration (at %)). In Examples 2-1 to 2-4, the magnetostriction elements had varying Ga concentrations at spots A, B, and C. The magnetostriction elements of Comparative Examples 2-1 and 2-3 had a constant Ga concentration. The magnetostriction element of Comparative Example 2-2 had the same Ga concentrations at spots A, B, and C as Example 2-1. The magnetostriction elements were produced and cut (wire discharge machining) in the same manner as in Example 1-1. The magnetostriction elements were measured for magnetic flux density under no applied stress and applied compressional stress in the same manner as in Example 1-1.

Evaluation of Power Density in Magnetostriction-Type Vibration Powered Generator Equipped with Magnetostriction Element The magnetostriction elements produced in the manner described above were each installed in a magnetostriction-type vibration powered generator of the configuration shown in FIGS. 3 and 4. In Examples 2-1 to 2-4 and Comparative Examples 2-1 and 2-3, the magnetostriction element was installed in such an orientation that spot C was on the diaphragm side (free-end side), and spot A was on the frame side (fixed-end side). The orientation was reversed in Comparative Example 2-2. The magnetostriction-type vibration powered generator equipped with the magnetostriction element was fitted to a vibrator, and the power density was measured. Specifically, vibration was applied from the vibrator at an acceleration of 2 G. The generated voltage was detected with an oscilloscope, and the resonant-frequency power output was calculated. The power density was then determined by dividing the calculated value by the size of the magnetostriction-type vibration powered generator.

As mentioned above, a magnetostriction-type vibration powered generator applied to a tire air pressure monitoring system or a sensor network for factories requires a consumed power density of at least about 1.0 mW/cm$^3$. By using this as a reference, the power density was determined as being acceptable when the calculated value was 1.0 mW/cm$^3$ or more, and unacceptable when the calculated value was less than 1.0 mW/cm$^3$.

Table 2 shows the measurement results for Examples 2-1 to 2-4 and Comparative Examples 2-1 to 2-3, specifically, the Ga concentrations at spots A, B, and C of the FeGa-alloy magnetostriction element, the magnetic flux density under no applied stress and under applied compressional stress, the magnetic flux density difference under no applied stress and under applied compressional stress, the installation direction of the magnetostriction element in the magnetostriction-type vibration powered generator, and the power density values, along with the evaluation results.

TABLE 2

|  |  |  | Ex. 2-1 | Ex. 2-2 | Ex. 2-3 | Ex. 2-4 |
| --- | --- | --- | --- | --- | --- | --- |
| Magnetostriction element | Ga concentration at spot A [at. %] | | 19 | 19 | 18 | 17 |
| | Ga concentration at spot B [at. %] | | 17.5 | 17 | 16.5 | 15.5 |
| | Ga concentration at spot C [at. %] | | 16 | 15 | 15 | 14 |
| | Magnetic flux density [T] under no load | Near spot A | 1.65 | 1.65 | 1.55 | 1.2 |
| | | Near spot B | 1.2 | 1.25 | 1.15 | 0.8 |
| | | Near spot C | 0.75 | 0.85 | 0.75 | 0.4 |
| | Magnetic flux density [T] under 5 MPa compression | Near spot A | 1.6 | 1.6 | 1.4 | 1.1 |
| | | Near spot B | 1.1 | 1 | 0.9 | 0.6 |
| | | Near spot C | 0.4 | 0.45 | 0.45 | 0.1 |
| | Magnetic flux density [T] under 15 MPa compression | Near spot A | 0.85 | 0.85 | 0.8 | 0.7 |
| | | Near spot B | 0.75 | 0.7 | 0.65 | 0.6 |
| | | Near spot C | 0.6 | 0.55 | 0.55 | 0.4 |
| | Magnetic flux density difference [T] under no load and under applied 5 MPa compression | Near spot A | 0.05 | 0.05 | 0.15 | 0.1 |
| | | Near spot B | 0.1 | 0.25 | 0.25 | 0.2 |
| | | Near spot C | 0.35 | 0.4 | 0.3 | 0.3 |
| | Magnetic flux density difference [T] under no load and under applied 15 MPa compression | Near spot A | 0.8 | 0.8 | 0.75 | 0.5 |
| | | Near spot B | 0.45 | 0.55 | 0.5 | 0.2 |
| | | Near spot C | 0.15 | 0.3 | 0.2 | 0 |

TABLE 2-continued

| | | | | | |
|---|---|---|---|---|---|
| Magnetostriction-type vibration powered generator | Frame side (fixed-end side) Diaphragm side (free-end side) | Spot A Spot C | Spot A Spot C | Spot A Spot C | Spot A Spot C |
| | Power density [mW/cm³] Evaluation result | 2.1 Acceptable | 1.9 Acceptable | 1.8 Acceptable | 1.6 Acceptable |

| | | | Com. Ex. 2-1 | Com. Ex. 2-2 | Com. Ex. 2-3 |
|---|---|---|---|---|---|
| Magnetostriction element | Ga concentration at spot A [at. %] | | 19 | 19 | 17 |
| | Ga concentration at spot B [at. %] | | 19 | 17.5 | 17 |
| | Ga concentration at spot C [at. %] | | 19 | 16 | 17 |
| | Magnetic flux density [T] under no load | Near spot A | 1.65 | 1.65 | 1.25 |
| | | Near spot B | 1.65 | 1.2 | 1.25 |
| | | Near spot C | 1.65 | 0.75 | 1.25 |
| | Magnetic flux density [T] under 5 MPa compression | Near spot A | 1.6 | 1.6 | 1 |
| | | Near spot B | 1.6 | 1.1 | 1 |
| | | Near spot C | 1.6 | 0.4 | 1 |
| | Magnetic flux density [T] under 15 MPa compression | Near spot A | 0.85 | 0.85 | 0.7 |
| | | Near spot B | 0.85 | 0.75 | 0.7 |
| | | Near spot C | 0.85 | 0.6 | 0.7 |
| | Magnetic flux density difference [T] under no load and under applied 5 MPa compression | Near spot A | 0.05 | 0.05 | 0.25 |
| | | Near spot B | 0.05 | 0.1 | 0.25 |
| | | Near spot C | 0.05 | 0.35 | 0.25 |
| | Magnetic flux density difference [T] under no load and under applied 15 MPa compression | Near spot A | 0.8 | 0.8 | 0.55 |
| | | Near spot B | 0.8 | 0.45 | 0.55 |
| | | Near spot C | 0.8 | 0.15 | 0.55 |
| Magnetostriction-type vibration powered generator | Frame side (fixed-end side) Diaphragm side (free-end side) | | Spot A Spot C | Spot C Spot A | Spot A Spot C |
| | Power density [mW/cm³] Evaluation result | | 0.7 Unacceptable | 0.5 Unacceptable | 0.4 Unacceptable |

As shown in Table 2, the power density was 1.0 mW/cm³ or more, and the values were acceptable in all of Examples 2-1 to 2-4.

In Example 2-1, the Ga concentration monotonously decreased with the measured value of 19 at % at spot A, 17.5 at % at spot B, and 16 at % at spot C. The magnetic flux density under no applied stress also decreased with the measured value of 1.65 at spot A, 1.2 T at spot B, and 0.75 T at spot C. Under applied compressional stress (5 MPa) the magnetic flux density showed a decrease from 1.6 T at spot A to 1.1 T at spot B, and to 0.4 T at spot C. Under applied compressional stress (15 MPa) the magnetic flux density showed a decrease from 0.85 T at spot A to 0.75 T at spot B, and to 0.6 T at spot C. These results also suggest that there is a correlation between Ga concentration and magnetic flux density, as in Example 1-1. By focusing on the magnetic flux density difference under no applied stress and under applied compressional stress in Example 2-1, the largest magnetic flux density difference under no applied stress and under an applied compressional stress of 5 MPa was 0.35 T, and this occurred at spot C. Under no applied stress and under an applied compressional stress of 15 MPa, the largest magnetic flux density difference was 0.8 T, and this occurred at spot A.

In Example 2-1, the magnetostriction element was installed in the magnetostriction-type vibration powered generator in such an orientation that spot A, where the magnetic flux density difference under no applied stress and under an applied compressional stress of 15 MPa (under a large applied stress) was the greatest and the Ga concentration was the highest, was on the frame side (fixed-end side), and spot C, where the magnetic flux density difference under no applied stress and under an applied compressional stress of 5 MPa (under a small applied stress; was the greatest and the Ga concentration was the lowest, was on the diaphragm side (free-end side). This is probably the reason for the increased magnetic flux density change in the FeGa-alloy magnetostriction element as a whole, and the Large power density of 1.0 mW; cm³ or more.

The same pattern was observed in Examples 2-2 to 2-4. In Example 2-2, the largest magnetic flux density difference under no applied stress and under an applied compressional stress of 5 MPa was 0.4 T, and this occurred at spot C. Under no applied stress and under an applied compressional stress of 15 MPa, the largest magnetic flux density difference was 0.8 T, and this occurred at spot A. In Example 2-3, the largest magnetic flux density difference under no applied stress and under an applied compressional stress of 5 MPa was 0.3 and this occurred at spot C. Under no applied stress and under an applied compressional stress of 15 MPa, the largest magnetic flux density difference was 0.75 T, and this occurred at spot A. In Example 2-4, the largest magnetic flux density difference under no applied stress and under an applied compressional stress of 5 MPa was 0.3 T, and this occurred at spot C. Under no applied stress and under an applied compressional stress of 15 MPa, the largest magnetic flux density difference was 0.55 and this occurred at spot A. As in Example 2-1, the magnetostriction element was installed in the magnetostriction-type vibration powered generator in such an orientation that spot A, where the magnetic flux density difference under no applied stress and under an applied compressional stress of 15 MPa (under a large applied stress) was the greatest and the Ga concentration was the highest, was on the frame side (fixed-end side), and spot C, where the magnetic flux density difference under no applied stress and under an applied compressional stress of 5 MPa (under a small applied stress) was the greatest and the Ga concentration was the lowest, was on the diaphragm side (free-end side). This is probably the reason for the increased magnetic flux density change in the FeGa-alloy magnetostriction element as a whole, and the large power density of 1.0 mW/cm$^3$ or more.

As shown in Table 2, the power density was less than 1.0 mW/cm$^3$, and the values were unacceptable in Comparative Examples 2-1 and 2-3 in which the magnetostriction elements of uniform Ga concentration were installed. The smaller power density values are probably due to the smaller magnetic flux density changes occurring in the magnetostriction element as a whole as a result of the stress being distributed over the frame side (fixed-end side) and the diaphragm side (free-end side) of the magnetostriction element in the magnetostriction-type vibration powered generator, and thus creating a distribution in the magnetic field lines running through the magnetostriction element formed of magnetostrictive material. In Comparative Example 2-2, the magnetostriction element was installed in the magnetostriction-type vibration powered generator in such an orientation that spot A, where the magnetic flux density difference under no applied stress and under an applied compressional stress of 15 MPa (under a large applied stress) was the greatest and the Ga concentration was the highest, was on the diaphragm side (free-end side), and spot C, where the magnetic flux density difference under no applied stress and under an applied compressional stress of 5 MPa (under a small applied stress) was the greatest and the Ga concentration was the highest, was on the frame side (fixed-end side) This is probably the reason for the decreased magnetic flux density change in the FeGa-alloy magnetostriction element as a whole, and the small power density of less than 1.0 mW/cm$^3$. That is, the smaller power density is considered to be due to the smaller magnetic flux density change occurring in the magnetostriction element in the magnetostriction-type vibration powered generator as a whole.

Example 3

In Example 3, the Ga concentration of the FeGa alloy of Example 1-1 was varied, and a trace amount of Sm, Cu, or C was added to produce magnetostriction elements. For the evaluation of the power density of the magnetostriction element, the magnetostriction element was installed in the magnetostriction-type vibration powered generator in the same manner as in Example 2, and the power density was measured to confirm the effectiveness of adding these additional elements, Evaluation of Power Density in Magnetostriction-Type Vibration Powered Generator Equipped with Magnetostriction Element The magnetostriction elements used for measurement had a plate shape as in Example 1-1. The Ga concentrations (at %) at spots A, B, and C of the magnetostriction elements had the values shown in Tables 3-1 and 3-2 (spot A: 19; spot B: 17.5; spot C: 16) and in Tables 4-1 and 4-2 (spot A: 17; spot B: 15.5; spot C: 14) as measured by EPMA analysis. Tables 3-1 and 3-2 and Tables 4-1 and 4-2 also show the type of the additional element, Sm, Cu, or C, added to the magnetostriction elements of Examples 3-1 to 3-12, along with the concentrations (at %) of these elements. The additional element, Sm, Cu, or C, was also added in Comparative Examples 3-1 to 3-14. However, in Comparative Examples 3-1, 3-2, 3-4 to 3-9, and 3-11 to 3-14, these were added in different amounts from the amounts added in Examples. In Comparative Examples 3-3 and 3-10, the magnetostriction element was installed in the magnetostriction-type vibration powered generator in the reversed direction from the other Comparative Examples.

The magnetostriction elements were produced and cut (wire discharge machining) in the same manner as in Example 1-1. However, the additional element, Sm, Cu, or C, was supplied as a raw material to the crucible in the first step after weighing these elements with Fe and Ga (both have 99.99% purity) in the first step. The Sm, Cu, or C content was measured and adjusted by EPMA analysis, as was the case for Fe and Ga. The magnetostriction elements had no concentration gradient for Sm, Cu, and C, even though the magnetostriction elements were produced in the same manner as in Example 1-1. This is probably due to the much lower melting point of gallium compared to the other elements, causing gallium to preferentially vaporize. Another possibility is only the trace amount of Sm, Cu, or C added. The power density of the magnetostriction element in the magnetostriction-type vibration powered generator was measured and evaluated in the same manner as in Example 2.

Tables 3-1 and 3-2 and Tables 4-1 and 4-2 show the measurement results for Examples 3-1 to 3-6 and Comparative Examples 3-1 to 3-7 and for Examples 3-7 to 3-12 and Comparative Examples 3-8 to 3-14, specifically, the Ga concentrations at spots A, B, and C of the magnetostriction element, the type and concentration of the additional element, the installation direction of the magnetostriction element in the magnetostriction-type vibration powered generator, and the measured power density values, along with the evaluation results.

TABLE 3-1

|  |  | Ex. 3-1 | Ex. 3-2 | Ex. 3-3 | Ex. 3-4 | Ex. 3-5 | Ex. 3-6 |
|---|---|---|---|---|---|---|---|
| Magnetostriction element | Ga concentration at spot A [at. %] | 19 | 19 | 19 | 19 | 19 | 19 |
|  | Ga concentration at spot B [at. %] | 17.5 | 17.5 | 17.5 | 17.5 | 17.5 | 17.5 |
|  | Ga concentration at spot C [at. %] | 16 | 16 | 16 | 16 | 16 | 16 |
|  | Concentration of additional element [at. %]  Sm | 1.0 | 0 | 0 | 0 | 0.5 | 0 |
|  | Cu | 0 | 0.5 | 0 | 0 | 0 | 1.0 |
|  | C | 0 | 0 | 1.0 | 0.5 | 0 | 0 |

TABLE 3-1-continued

|  |  | Ex. 3-1 | Ex. 3-2 | Ex. 3-3 | Ex. 3-4 | Ex. 3-5 | Ex. 3-6 |
|---|---|---|---|---|---|---|---|
| Vibration powered generator | Frame side (fixed end) | Spot A | Spot A | Spot A | Spot A | Spot A | Spot A |
|  | Diaphragm side (free end) | Spot C | Spot C | Spot C | Spot C | Spot C | Spot C |
|  | Power density [mW/cm$^3$] | 2.3 | 2.2 | 2.2 | 2.2 | 2.3 | 2.4 |
|  | Evaluation result | Acceptable | Acceptable | Acceptable | Acceptable | Acceptable | Acceptable |

TABLE 3-2

|  |  | Com. Ex. 3-1 | Com. Ex. 3-2 | Com. Ex. 3-3 | Com. Ex. 3-4 |
|---|---|---|---|---|---|
| Magnetostriction element | Ga concentration at spot A [at. %] | 19 | 19 | 19 | 19 |
|  | Ga concentration at spot B [at. %] | 17.5 | 17.5 | 17.5 | 17.5 |
|  | Ga concentration at spot C [at. %] | 16 | 16 | 16 | 16 |
|  | Concentration of additional element [at. %] Sm | 1.1 | 0.4 | 1.0 | 0 |
|  | Cu | 0 | 0 | 0 | 1.1 |
|  | C | 0 | 0 | 0 | 0 |
| Vibration powered generator | Frame side (fixed end) | Spot A | Spot A | Spot C | Spot A |
|  | Diaphragm side (free end) | Spot C | Spot C | Spot A | Spot C |
|  | Power density [mW/cm$^3$] | 0.8 | 0.9 | 0.7 | 0.5 |
|  | Evaluation result | Unacceptable | Unacceptable | Unacceptable | Unacceptable |

|  |  | Com. Ex. 3-5 | Com. Ex. 3-6 | Com. Ex. 3-7 |
|---|---|---|---|---|
| Magnetostriction element | Ga concentration at spot A [at. %] | 19 | 19231 | 19 |
|  | Ga concentration at spot B [at. %] | 17.5 | 17.5 | 17.5 |
|  | Ga concentration at spot C [at. %] | 16 | 16 | 16 |
|  | Concentration of additional element [at. %] Sm | 0 | 0 | 0 |
|  | Cu | 0.4 | 0 | 0 |
|  | C | 0 | 1.1 | 0.4 |
| Vibration powered generator | Frame side (fixed end) | Spot A | Spot A | Spot A |
|  | Diaphragm side (free end) | Spot C | Spot C | Spot C |
|  | Power density [mW/cm$^3$] | 0.7 | 0.9 | 0.8 |
|  | Evaluation result | Unacceptable | Unacceptable | Unacceptable |

TABLE 4-1

|  |  | Ex. 3-7 | Ex. 3-8 | Ex. 3-9 | Ex. 3-10 | Ex. 3-11 | Ex. 3-12 |
|---|---|---|---|---|---|---|---|
| Magnetostriction element | Ga concentration at spot A [at. %] | 17 | 17 | 17 | 17 | 17 | 17 |
|  | Ga concentration at spot B [at. %] | 15.5 | 15.5 | 15.5 | 15.5 | 15.5 | 15.5 |
|  | Ga concentration at spot C [at. %] | 14 | 14 | 14 | 14 | 14 | 14 |
|  | Concentration of additional element [at. %] Sm | 1.0 | 0 | 0 | 0 | 0.5 | 0 |
|  | Cu | 0 | 0.5 | 0 | 0 | 0 | 1.0 |
|  | C | 0 | 0 | 1.0 | 0.5 | 0 | 0 |
| Vibration powered generator | Frame side (fixed end) | Spot A | Spot A | Spot A | Spot A | Spot A | Spot A |
|  | Diaphragm side (free end) | Spot C | Spot C | Spot C | Spot C | Spot C | Spot C |
|  | Power density [mW/cm$^3$] | 1.7 | 1.8 | 1.8 | 1.9 | 1.7 | 1.6 |
|  | Evaluation result | Acceptable | Acceptable | Acceptable | Acceptable | Acceptable | Acceptable |

TABLE 4-2

|  |  | Com. Ex. 3-8 | Com. Ex. 3-9 | Com. Ex. 3-10 | Com. Ex. 3-11 |
|---|---|---|---|---|---|
| Magnetostriction element | Ga concentration at spot A [at. %] | 17 | 17 | 17 | 17 |
|  | Ga concentration at spot B [at. %] | 15.5 | 15.5 | 15.5 | 15.5 |
|  | Ga concentration at spot C [at. %] | 14 | 14 | 14 | 14 |
|  | Concentration of additional element [at. %]   Sm | 1.1 | 0.4 | 1.0 | 0 |
|  | Cu | 0 | 0 | 0 | 1.1 |
|  | C | 0 | 0 | 0 | 0 |
| Vibration powered generator | Frame side (fixed end) | Spot A | Spot A | Spot C | Spot A |
|  | Diaphragm side (free end) | Spot C | Spot C | Spot A | Spot C |
|  | Power density [mW/cm$^3$] | 0.5 | 0.7 | 0.6 | 0.4 |
|  | Evaluation result | Unacceptable | Unacceptable | Unacceptable | Unacceptable |

|  |  | Com. Ex. 3-12 | Com. Ex. 3-13 | Com. Ex. 3-14 |
|---|---|---|---|---|
| Magnetostriction element | Ga concentration at spot A [at. %] | 17 | 17 | 17 |
|  | Ga concentration at spot B [at. %] | 15.5 | 15.5 | 15.5 |
|  | Ga concentration at spot C [at. %] | 14 | 14 | 14 |
|  | Concentration of additional element [at. %]   Sm | 0 | 0 | 0 |
|  | Cu | 0.4 | 0 | 0 |
|  | C | 0 | 1.1 | 0.4 |
| Vibration powered generator | Frame side (fixed end) | Spot A | Spot A | Spot A |
|  | Diaphragm side (free end) | Spot C | Spot C | Spot C |
|  | Power density [mW/cm$^3$] | 0.6 | 0.5 | 0.4 |
|  | Evaluation result | Unacceptable | Unacceptable | Unacceptable |

As shown in Tables 3-1 and 4-1, the power density was 1.0 mW/cm$^3$ or more, and the values were acceptable in Examples 3-1, 3-2, 3-7, and 3-8 in which trace amounts of Sm were added. This is probably due to the increased magnetic flux density change as a result of improved saturation flux density created by (i) the localized strain induced by addition of Sm having a larger atomic radius than Fe and Ga, and (ii) the magnetic anisotropy produced in the crystals by the quadruple moment of the 4f electron of samarium.

Comparative Examples 3-1 and 3-8, in which samarium was added in an amount of 1.1 at %, had power densities of 0.8 mW/cm$^3$ and 0.5 mW/cm$^3$, respectively, and the values were unacceptable, as shown in Tables 3-2 and 4-2. These small power density values are probably due to the samarium being added beyond the solid solubility limit, and the emergence of the second phase inhibiting the movement of the domain wall and reducing the magnetic flux density change.

Comparative Examples 3-2 and 3-9, in which samarium was added in an amount of 0.4 at %, had power densities of 0.9 mW/cm$^3$ and 0.7 mW/cm$^3$, respectively, and the values were unacceptable, as shown in Tables 3-2 and 4-2. This is probably because the samarium content was too small to sufficiently improve the saturation flux density.

It can be said from these results that the Sm concentration (at %) must fall in a range of $0.5 \leq Sm \leq 1.0$ to achieve a power density of 1.0 mW/cm$^3$ or more.

As shown in Tables 3-2 and 4-2, the power density was 0.7 mW/cm$^3$ in Comparative Example 3-3, and 0.6 mW/cm$^3$ in Comparative Example 3-10, and the values were unacceptable in these comparative examples in which samarium was added, and in which the magnetostriction element was installed in such an orientation that spot C of lower Ga concentration was on the frame side, and spot A of higher Ga concentration was on the diaphragm side. These small power density values are probably due to the smaller magnetic flux density change occurring in the magnetostriction element as a whole as a result of the reduced magnetic flux density difference under no applied stress and under applied compressional stress due to the installation direction of the magnetostriction element, as in Example 2.

As shown in Tables 3-1 and 4-1, the power density was 1.0 mW/cm$^3$ or more, and the values were acceptable in Examples 3-3, 3-4, 3-9, and 3-10 in which trace amounts of copper were added. This is probably a result of the addition of copper increasing the magnetic anisotropic energy of the crystals in the alloy.

As shown in Tables 3-2 and 4-2, the power density was 0.5 mW/cm$^3$ in Comparative Example 3-4, and 0.4 mW/cm$^3$ in Comparative Example 3-11, and the values were unacceptable in these comparative examples in which Cu was added in an amount of 1.1 at %. These small power density values are probably due to the copper being added beyond the solid solubility limit, and the precipitation of the FeCu-base compound inhibiting the movement of the domain wall and reducing the magnetic flux density change.

As shown in Tables 3-2 and 4-2, the power density was 0.7 mW/cm$^3$ in Comparative Example 3-5, and 0.6 mW/cm$^3$ in Comparative Example 3-12, and the values were unacceptable in these comparative examples in which Cu was added in an amount of 0.4 at %. This is probably because the copper content was too small to sufficiently improve the saturation flux density.

It can be said from these results that the Cu concentration (at %) must fall in a range of $0.5 \leq Cu \leq 1.0$ to achieve a power density of 1.0 mW/cm$^3$ or more.

As shown in Tables 3-1 and 4-1, the power density was 1.0 mW/cm$^3$ or more, and the values were acceptable in Examples 3-5, 3-6, 3-11, and 3-12 in which trace amounts of carbon were added. This is probably a result of the addition of carbon inducing tetragonal crystal strain in the Fe lattice.

As shown in Tables 3-2 and 4-2, the power density was 0.9 mW/cm$^3$ in Comparative Example 3-6, and 0.5 mW/cm$^3$ in Comparative Example 3-13, and the values were unacceptable in these comparative examples in which C was added in an amount of 1.1 at %. These small power density values are probably due to the higher content of carbon than gallium preventing entry of carbon atoms into the Fe lattice, and reducing the saturation flux density and the magnetic flux density change.

As shown in Tables 3-2 and 4-2, the power density was 0.8 mW/cm$^3$ in Comparative Example 3-7, and 0.4 mW/cm$^3$ in Comparative Example 3-14, and the values were unacceptable in these comparative examples in which C was added in an amount of 0.4 at %. This is probably because the carbon content was too small to sufficiently induce tetragonal crystal strain in the Fe lattice.

It can be said from these results that the C concentration (at %) must fall in a range of 0.5≤C≤1.0 to achieve a power density of 1.0 mW/cm$^3$ or more.

The results of the power density measurement in the magnetostriction-type vibration powered generator equipped with the magnetostriction element prepared by adding one of Sm, Cu, and C to the FeGa alloy confirmed that addition of these additional elements produces a desirable effect, specifically, a power density of 1.0 mW/cm$^3$ or more, when 0.5≤β≤1.0 is satisfied in the formula (1) represented by $Fe_{(100-\alpha-\beta)}Ga_\alpha X_\beta$, where α and β are the Ga content (at %) and the X content (at %), respectively.

Because samarium is a rare earth, the same effect should be obtained with the rare earths Eu, Gd, Tb, and Dy.

A magnetostriction element of the present disclosure shows large magnetostriction, and a magnetostriction-type vibration powered generator using the magnetostriction element has high power density. This makes possible to provide, for example, a magnetostriction-type sensor or a magnetostriction-type actuator that could open the door to more effective IoT.

What is claimed is:

1. A magnetostriction element comprising a magnetostrictive material that is a monocrystalline alloy represented by the following formula (1), $$Fe_{(100-\alpha-\beta)}Ga_\alpha X_\beta, \quad \text{Formula (1)}$$

wherein α and β represent Ga content (at %) and X content (at %), respectively, X is at least one element selected from a group consisting of Sm, Eu, Gd, Tb, Dy, Cu, and C, and the formula satisfies 5≤α≤40, and 0≤β≤1, the magnetostriction element having a longitudinal direction along which the magnetostriction element extends between opposing first and second ends, the magnetostriction element having a <100> crystal orientation of the monocrystalline alloy along a direction parallel to the longitudinal direction, and having a Ga concentration gradient that decreases in a direction from the second end to the first end.

2. The magnetostriction element according to claim 1, wherein the magnetostriction element is plate-like in shape.

3. The magnetostriction element according to claim 1, wherein the Ga concentration is 14 at % or more and 16 at % or less at the first end, and 17 at % or more and 19 at % or less at the second end.

4. The magnetostriction element according to claim 1, wherein the Ga concentration decreases at an average rate of 0.15 at % or more and 0.2 at % or less per millimeter in the direction from the second end to the first end.

5. The magnetostriction element according to claim 1, wherein X is at least one element selected from the group consisting of Sm, Cu, and C, and the formula satisfies 14≤α≤19, and 0.5≤β≤1.

* * * * *